United States Patent
Shuy et al.

(10) Patent No.: US 6,667,072 B2
(45) Date of Patent: Dec. 23, 2003

(54) PLANARIZATION OF CERAMIC SUBSTRATES USING POROUS MATERIALS

(75) Inventors: Geoffrey Wen-Tai Shuy, Taipei (TW); Jong-Hong Lu, Taipei (TW); Sheng-Ju Liao, Hsin-Chu (TW); Huai-Luh Chang, Chung-Ho (TW); Song-Wein Hong, Chang-Hua Hsien (TW); Ruey-Cheng Huang, Taichung (TW)

(73) Assignee: Industrial Technology Research Institute, Hsien (TW)

( * ) Notice: Subject to any disclaimer, the term of this patent is extended or adjusted under 35 U.S.C. 154(b) by 0 days.

(21) Appl. No.: 10/023,878

(22) Filed: Dec. 21, 2001

(65) Prior Publication Data

US 2003/0118738 A1 Jun. 26, 2003

(51) Int. Cl.$^7$ .............................. B05D 5/12; B05D 1/36
(52) U.S. Cl. ...................... 427/58; 427/126.3; 427/402; 427/419.1; 427/419.2; 427/243
(58) Field of Search ........................ 427/58, 402, 419.2, 427/419.1, 243, 126.3

(56) References Cited

U.S. PATENT DOCUMENTS

| | | | | | |
|---|---|---|---|---|---|
| 5,952,040 | A | * | 9/1999 | Yadav et al. | 427/126.3 |
| 6,432,472 | B1 | * | 8/2002 | Farrell et al. | 427/79 |
| 6,503,382 | B1 | * | 1/2003 | Bartlett et al. | 205/67 |
| 2002/0167981 | A1 | * | 11/2002 | Eisenbeiser | 372/43 |

* cited by examiner

Primary Examiner—Michael Barr
(74) Attorney, Agent, or Firm—Bacon & Thomas, PLLC

(57) ABSTRACT

This invention provides a concept of using porous materials on ceramic substrate planarization. This planarized substrate consists of a ceramic substrate, a buffer layer, and a nanostructure layer. The ceramic substrate provides structural strength and surface-mount capability. The buffer layer provides the adhesion between the substrate and the nanostructure layer. The nanostructure layer provides the required surface smoothness of the ceramic substrates for performing thin-film processing techniques and enhances adhesion for metallization and electronic materials.

11 Claims, 8 Drawing Sheets

PLANARIZATION OF CERAMIC SUBSTRATES USING POROUS MATERIALS

BACKGROUND OF INVENTION

1. Field of Invention

This invention mainly provides a concept of using porous materials on ceramic substrate planarization. This planarized substrate can be utilized in the fields of electronic information communication, opto-electronics and display.

2. Description of the Prior Art

It is an important postulation for having a planar surface for the thin-film processes. The high cost is due to two main aspects. The first aspect is due to the high substrate-polishing cost based on either silicon wafer or glass manufacture factory. The second aspect is the high fabrication cost on the flattening technology as a key technology to produce metallized module IC.

At present, some common smoothing techniques include mechanical polishing, chemical mechanical polishing, chemical etching, high temperature reflow through borophosphosilicate, and spin coating. Thin film's roughness and adherence are often limited after surface treatment at which may additionally complicate the processing and increase the cost. The prior arts are shown as following:

| Prior Art | Focal technique | Defect |
| --- | --- | --- |
| US4944836: Chem-mech polishing (CMP) method for producing coplanar metal/insulator films on a substrate | A method for VLSI and ULSI (Ultra-Large Semiconductor Integration) offer "global planarization". The combination of mechanism polishing and chemical reagent to flatten silicon wafer. More than 94% of rough surface as consequence can be planarized by CMP method. | The chemical reagent used in CMP method is expensive and hard to be controlled during the process. And it is also lack of terminate detecting system. Finally, a trace of contaminant may be observed in polish process. |
| Silicon Processing for the VLS: Basics of Thin Films | Surface of silicon wafer recovered by a liquid solution via spin coating method, after heat treatment therefore a planar dielectric layer can be formed. A deep gap fill capability on such surface can be obtained by SOG method. | The spin on glass processing can provide only local planarization. Disadvantage may be observed for example like the formation of particles, film crack, delamination and exhausted out-gassing. |
| Solid State Technology: Viscous Behavior of Phosphosilicate, Borophosphosilicate and Germano-phosphosilicate Glasses in VLSI Processing. | A layer of low glass transition temperature materials BPSG deposition on a surface by CVD method. At high temperature reflow BPSG on the substrate and then resulting surface planarization. | Both $B_2H_6$ and $PH_3$ are chemically toxic and are employed in BPSG processing. This planarization can be applied to the planarizing dielectric barrier layer before metallization. After the coverage of Al metal layer however BPSG reflowing process cannot be applied. |
| Solid State Technology: Chemical Etching | Excess thick layer of $SiO_2$ deposited. The application of anisotropic-etch method can then etch back $SiO_2$ layer to desired thickness. | Only a partial planarization can be obtained by chemical etching method. It is not applicable. |

SUMMARY OF THE INVENTION

Conclusively, the main purpose of this invention can solve the above-mentioned defects (film crack, delamination, etc.). In order to overcome these problems, this invention provides a concept of using porous materials on ceramic substrate planarization, wherein the nanostructure layer provides the required surface smoothness upon the ceramic substrates and enhances the adhesion between substrate and subsequent thin-film layers.

This invention can tremendously reduce the production cost due to its simple production process.

In order to achieve the said objectives, the invention provides a method of using porous materials on ceramic substrate planarization. This invention sustains a surface flattening method by employing the participation of porous materials such as zeolites, zeolite-like, mesoporous and mesoporous composites. Meanwhile, this invention results in good affinity for the electrical and dielectric properties, for instance, thermal conductivity, electrical insulation, dielectric and other required properties for integrated components. Due to a good polarization obtained, this invention permits furthermore an intensive binding between thin films and electronic materials.

DETAILED DESCRIPTION OF THE PREFERRED EMBODIMENTS

Figure 1:
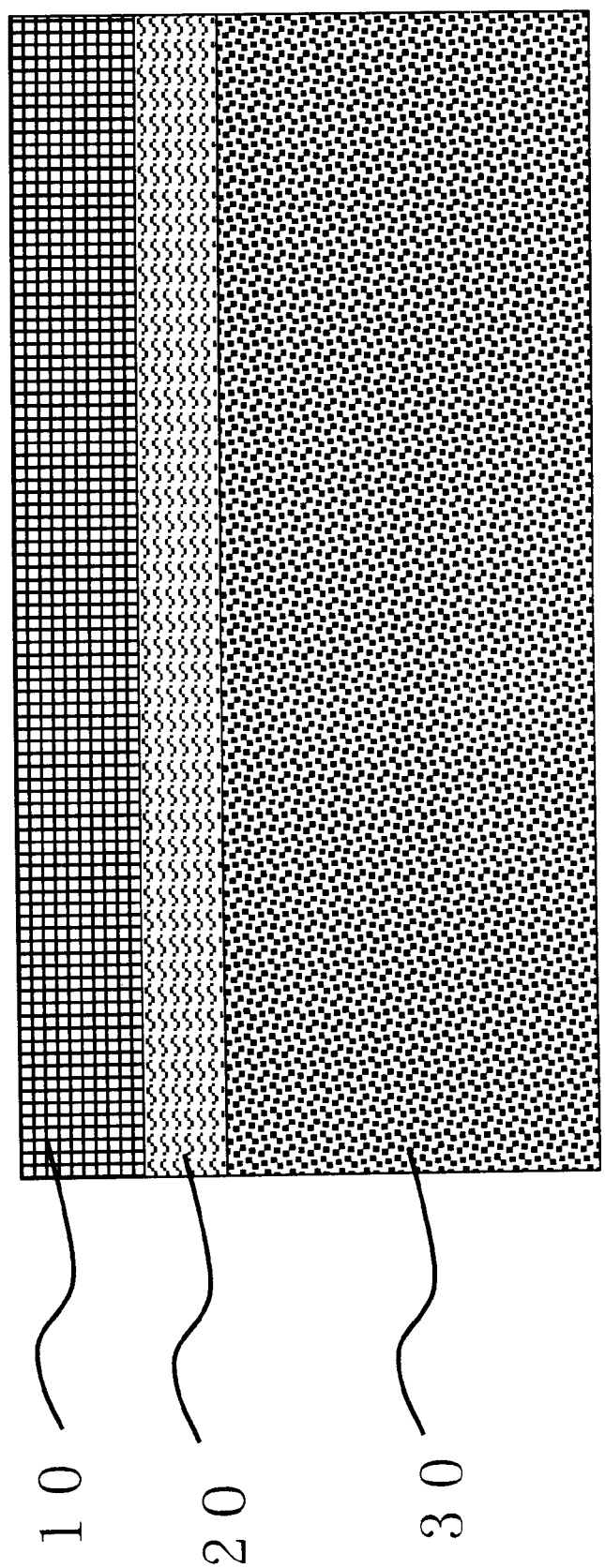
FIG. 1: Schematic drawing of the architecture of the smoothing technology indicated in the invention description.

This invention mainly provides a method of using porous materials on ceramic substrate planarization. The concept of this invention includes at least a layer of ceramic substrate 30, a buffer layer 20, and nanostructured layer 10. As shown in FIG. 1, it is a schematic drawing of the architecture of the smoothing technology indicated in the invention description. First this invention provides a ceramic substrate 30, then a buffer layer 20 forms on the ceramic substrate 30 and a nanostructure layer 10 forms upon the buffer layer 20.

The ceramic substrate 30 provides the structure stress and surface-mount capability. The buffer layer 20 provides the adhesion between the substrate layer 30 and nanostructured layer 10. The buffer layer 20 can be chosen from one of or some of the following materials: glaze, glass, ceramic, mesoporous and mesoporous composites. The nanostructure layer 10 is formed by the self repetitively assembled mechanism in order to offer the required surface smoothness of the ceramic substrates for performing the thin-film process techniques, adhesion for metallization and electronic materials, thermal conductivity, electrical insulation, dielectric and other electric material required functions. The nanostructure layer 10 is chosen from one of or some of the following materials: zeolites, zeolite-like, mesoporous and mesoporous composites. Moreover, the buffer layer 20 and nanostructure layer 10 can be either the same layer or multilayer.

The concept of the this invention utilizes the nanostructure layer 10 to provide required thermal conductivity, electrical insulation, adhesion, dielectric and other electric material required functions for the substrate that comprises LTCC, chip-carrier, passive device, active device, light emitting device, optical passive device and optical active device and their complexes.

The properties and the advantages of this invention are shown in the following example, which can be one of applications.

FIRST EXAMPLE

Flatness Test

Figure 2:
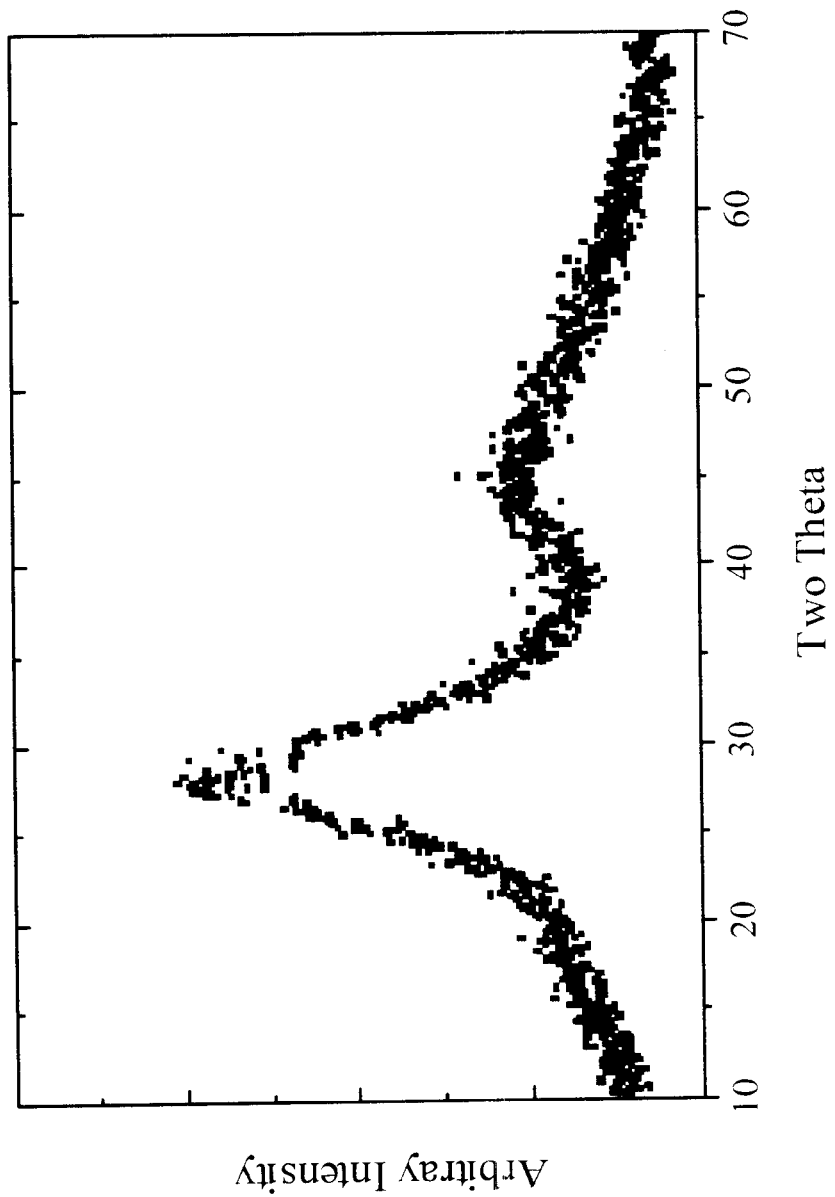
FIG. 2: X-ray photograph of example 1.
Figure 3:
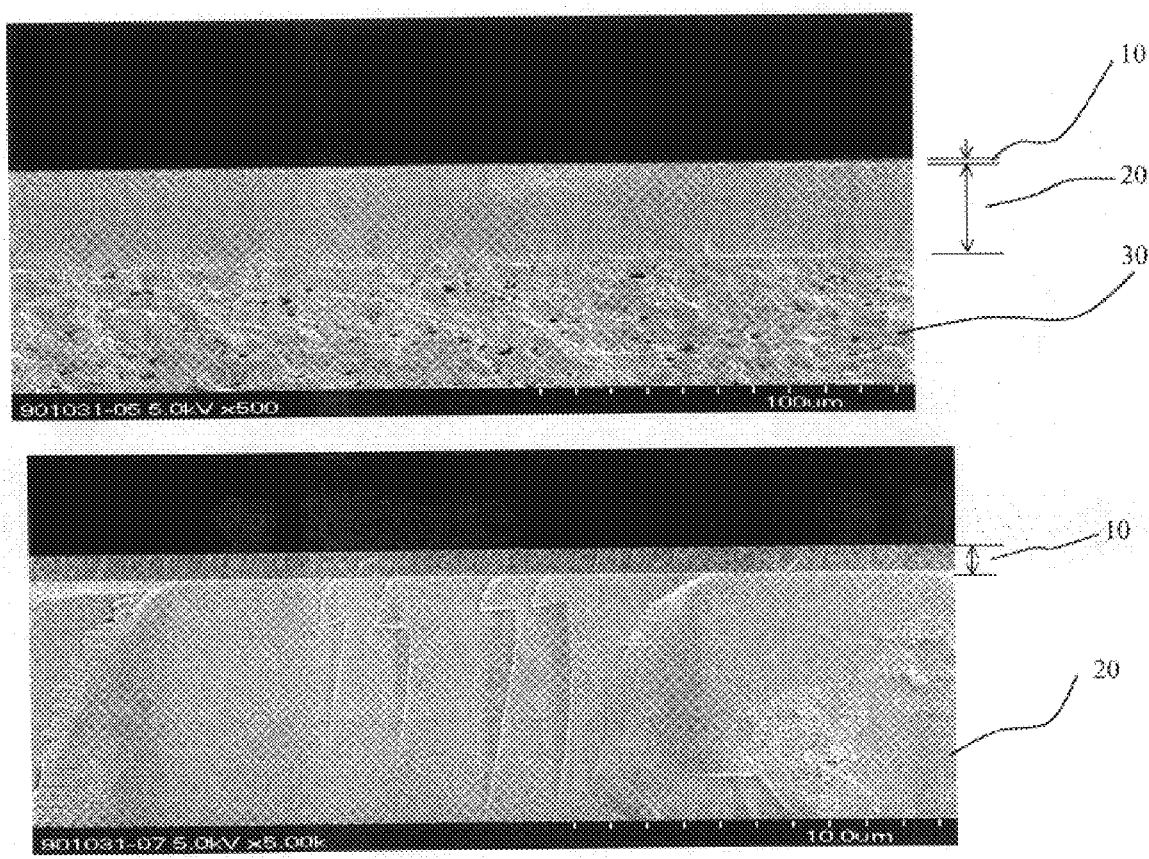
FIG. 3: SEM photograph of example 1.
Figure 4:
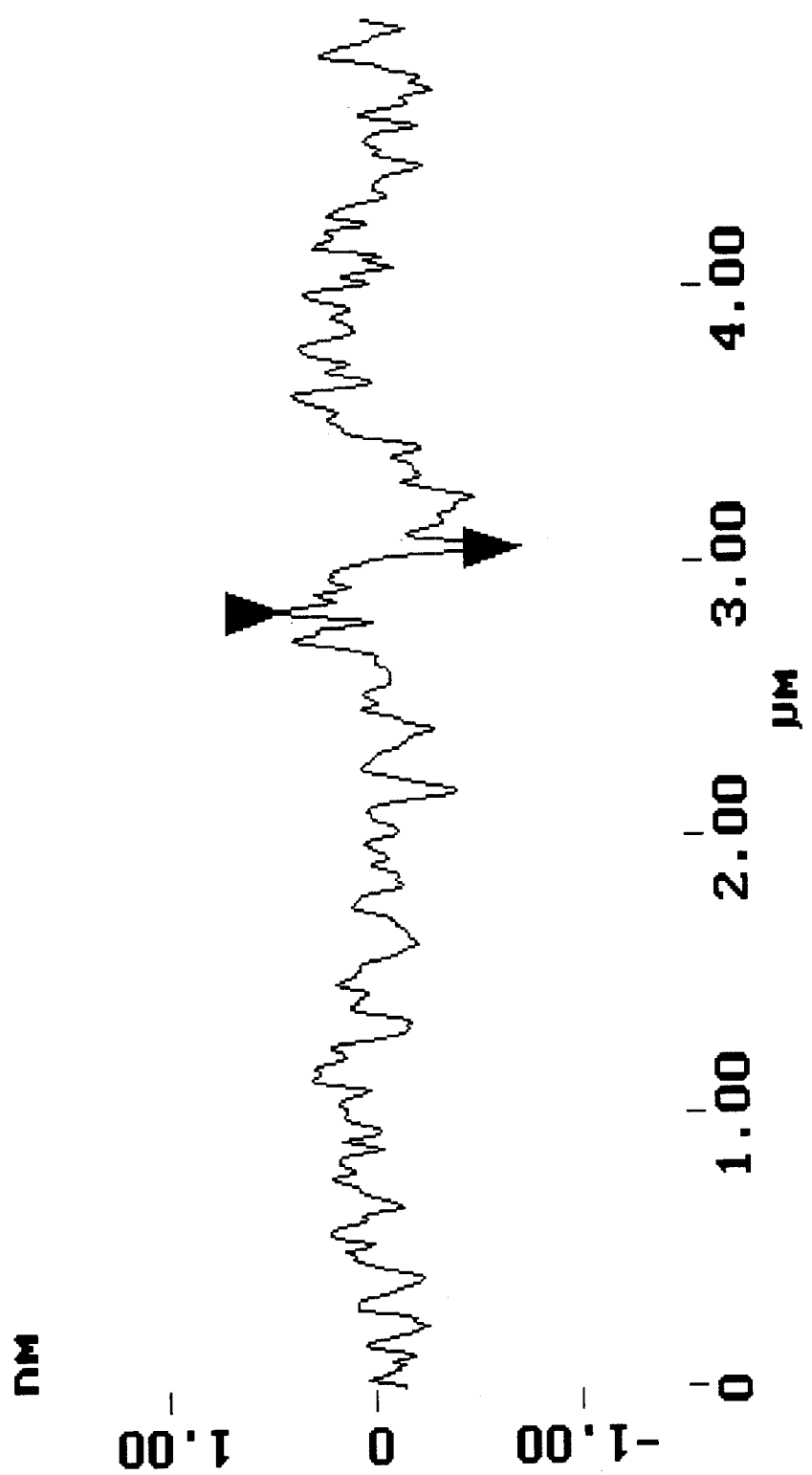
FIG. 4: Flatten result on the ceramic substrates surface.
Figure 5A:
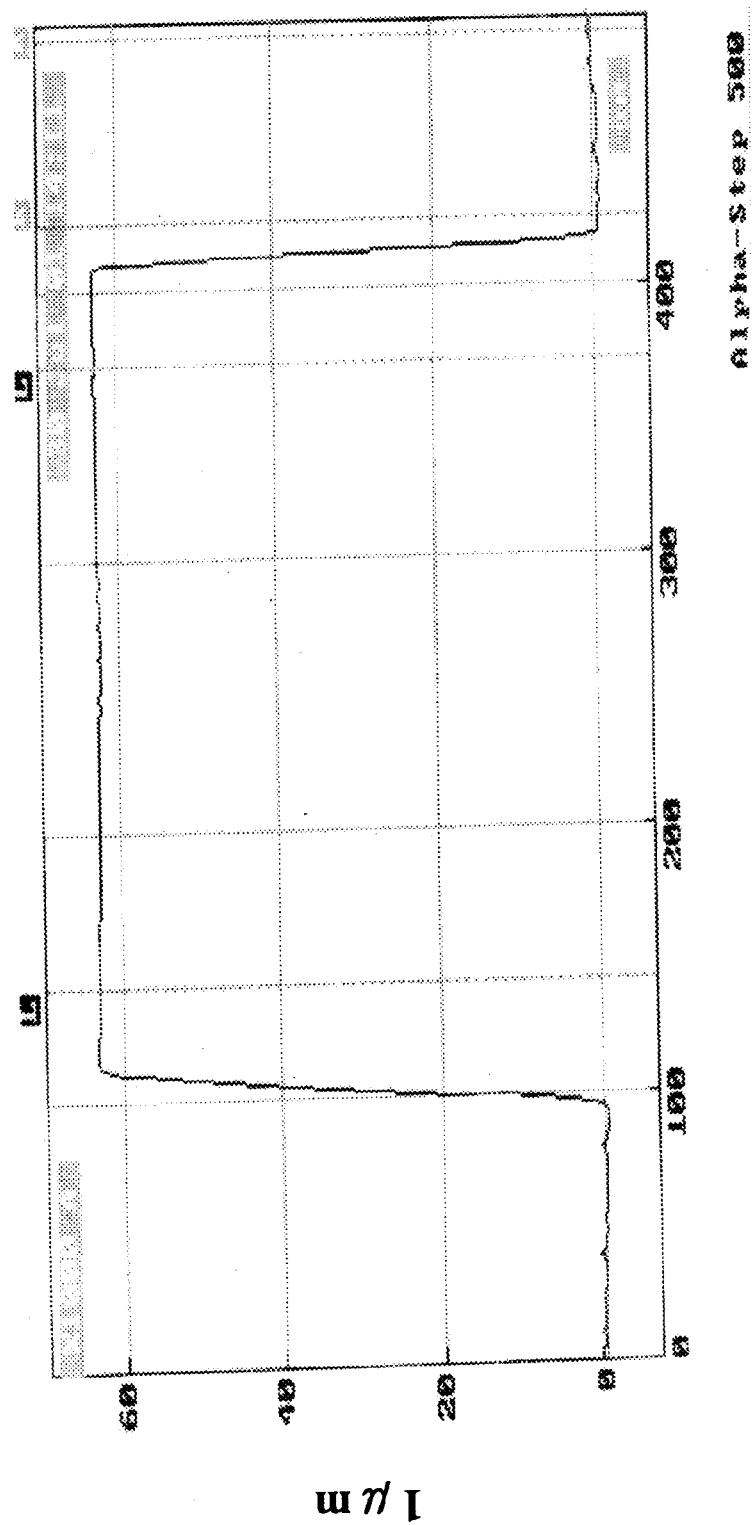
FIG. 5a: Adhesive test of example after deposition of an Al film having a thickness of 6.5 $\mu$m and patternization by photolithography.

The formation of sample as represented in FIG. 2, where substrate 30 was aluminum oxide, buffer layer 20 was glaze, and nanostructure layer 10 was zeolite-like material. X-ray analysis of crystal structure is shown in FIG. 3, the peak signal informs the self-assembly zeolite-like structure. The SEM picture given in FIG. 4 shows the profile of $Al_2O_3$ substrate of 30, glaze buffer layer 20 and nanostructure zeolite-like layer 10. The flatness measurement shown in FIG. 5 shows flatness in angstrom dimension.

SECOND EXAMPLE

Adhesion Test

Figure 5B:
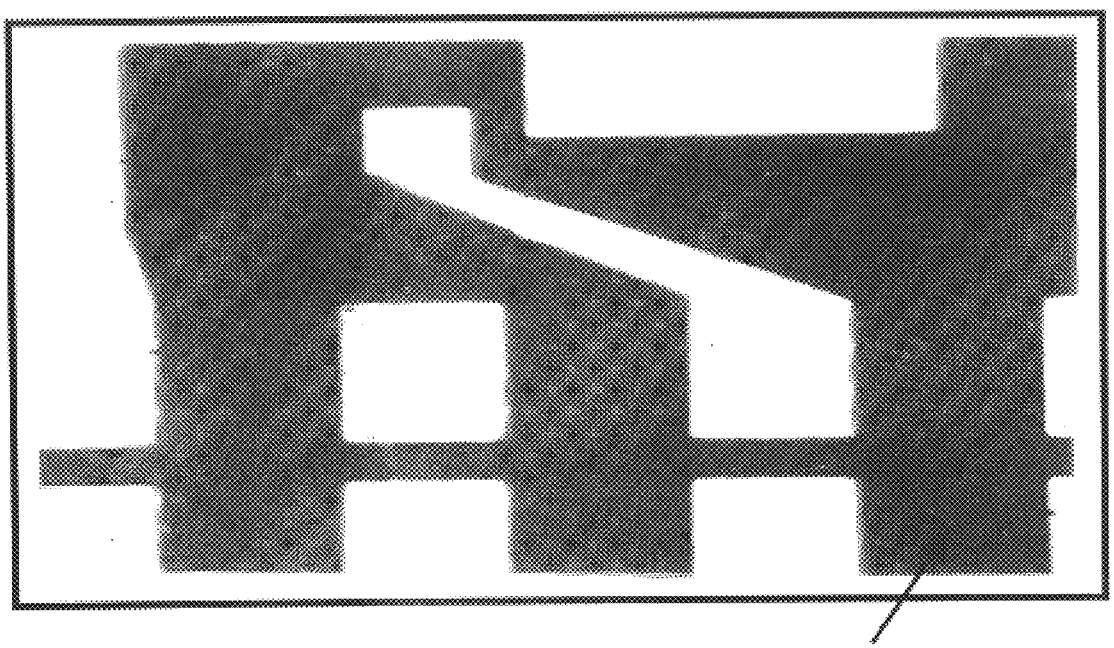
FIG. 5b: Optical picture of the flatten sample on which an Al film having a thickness of 6.5 $\mu$m has been deposited.
Figure 6A:
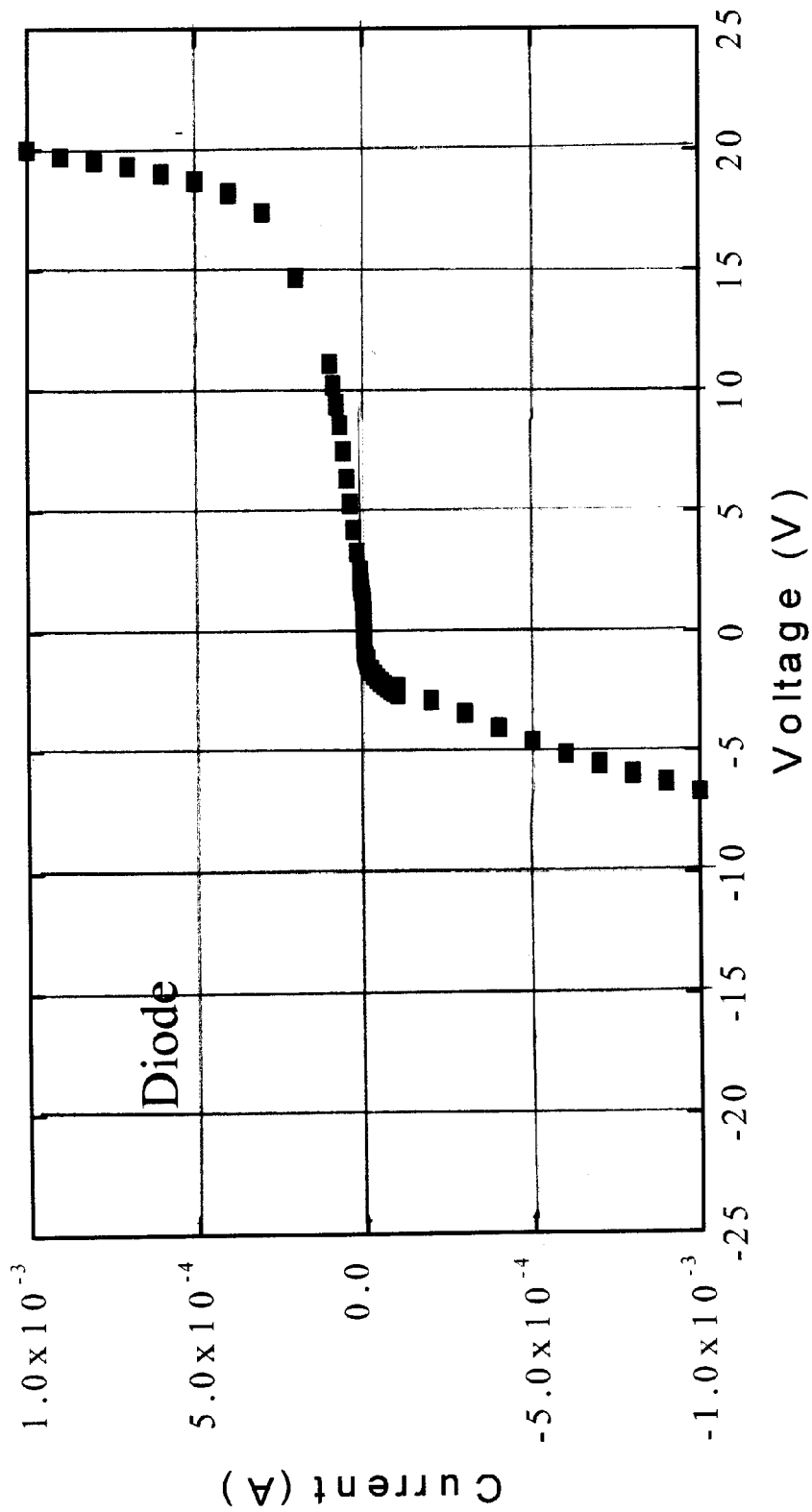
FIG. 6a: A current-voltage relationship of the diode which made from the flatten sample (first example).

As shown in FIG. 6a, it is the adhesive test of example 1 after deposited 6.5 $\mu$m thickness layers of Al film and patternized by photolithography. FIG. 5b is the optical picture of flatten sample deposited 6.5 $\mu$m thickness layers of Al film for adhesion test. A 6.5 $\mu$m thickness layer of Al film deposited on flatten sample and patternized by photolithography, this picture indicates an excellent adhesion between substrate and Al layer. It is fully agreement to the α-step profiling measurement shown in FIG. 5a.

THIRD EXAMPLE

Practicable Test

Figure 6B:
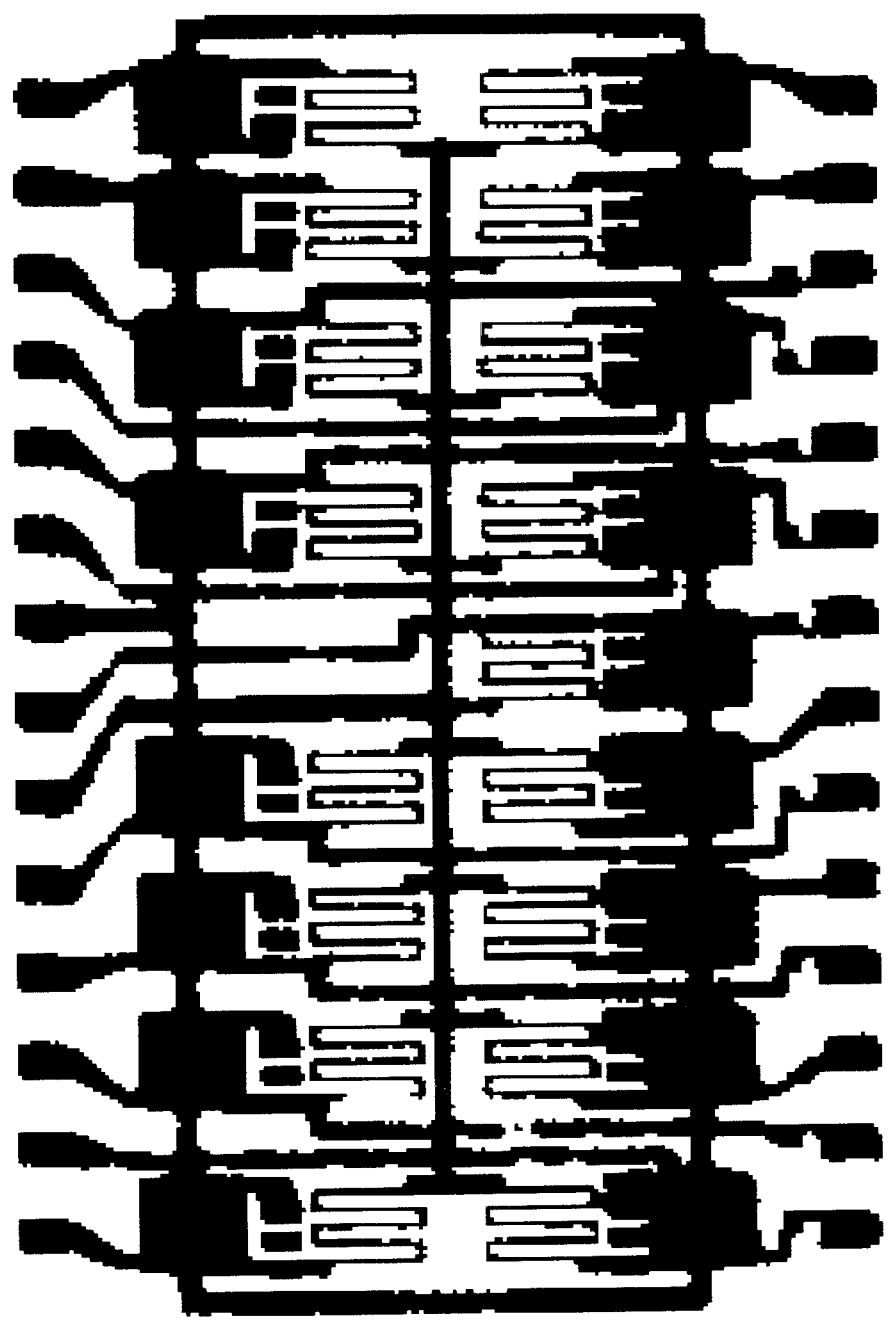
FIG. 6b: RLCD integrated circuit made from the flatten sample(first example).

As shown in FIG. 6a, it is the current-voltage relationship of the diode made from the flatten sample (first example), and in FIG. 6b, it is the RLCD integrated circuit made from the flatten sample (first example). Hence, these are evident examples that proof this invention is practicable.

It should be apparent to those skilled in the art that the above description is only illustrative of specific embodiments and examples of the invention. The invention should therefore cover various modifications and variations made to the herein-described structure and operations of the invention, provided they fall within the scope of the invention as defined in the following appended claims.

What is claimed is:

1. A method for planarizing a ceramic substrate which comprises:

providing a ceramic substrate 30;

forming a buffer layer 20 on said ceramic substrate 30; and forming a nanostructure layer 10 on said buffer layer 20;

wherein said nanostructure layer 10 is formed by a self repetitively assembled mechanism from porous material selected from the group consisting of zeolite, zeolite-like material, mesoporous and mesoporous composites and wherein said buffer layer 20 is formed from material selected from the group consisting of glaze, glass, ceramic, mesoporous and mesoporous composites.

2. The method of claim 1 wherein said ceramic substrate, said buffer layer and said nanostructure layer are adapted to provide adhesion, thermal conductivity, electrical insulation and dielectric properties for the fabrication of a passive device.

3. The method of claim 2, wherein said passive device is selected from the group consisting of resistors, inductors and capacitors.

4. The method of claim 1 wherein said nanostructure, said buffer layer and said ceramic substrate are adapted to provide adhesion, thermal conductivity, electrical insulation and dielectric properties for the fabrication of an active device.

5. The method of claim 4 wherein said active device is selected from the group consisting of transistors, diodes and memory devices.

6. The method of claim 1 wherein said nanostructure, said buffer layer and said ceramic substrate are adapted to provide adhesion, thermal conductivity, electrical insulation and dielectric properties for the fabrication of a light emitting device.

7. The method of claim 6 wherein said light emitting device is selected from the group consisting of laser diodes, LED devices and field emitters.

8. The method of claim 1 wherein said nanostructure, said buffer layer and said ceramic substrate are adapted to provide adhesion, thermal conductivity, electrical insulation, and dielectric properties for the fabrication of an optical passive device.

9. The method of claim 8 wherein said optical passive device is selected from the group consisting of wave guides and photodetectors.

10. The method of claim 1 wherein said nanostructure layer, said buffer layer and said ceramic substrate are adapted to provide adhesion, thermal conductivity, electrical insulation and dielectric properties for the fabrication of an optical active device.

11. The method of claim 10 wherein said optical active device is selected from the group consisting of optical amplifiers, optical switches and optical regulators.

* * * * *